United States Patent [19]
Tribbey et al.

[11] Patent Number: 5,232,736
[45] Date of Patent: Aug. 3, 1993

[54] METHOD FOR CONTROLLING SOLDER PRINTER

[75] Inventors: David A. Tribbey, Lake Worth; Donald P. Gebbia, Delray Beach, both of Fla.

[73] Assignee: Motorola, Inc., Schaumburg, Ill.

[21] Appl. No.: 850,001

[22] Filed: Mar. 10, 1992

Related U.S. Application Data

[63] Continuation of Ser. No. 634,946, Dec. 28, 1990, abandoned, which is a continuation of Ser. No. 384,354, Jul. 24, 1989, abandoned.

[51] Int. Cl.$^5$ .............................................. C23C 26/00
[52] U.S. Cl. ........................................... 427/8; 427/96
[58] Field of Search ................................. 427/96, 8

[56] References Cited

U.S. PATENT DOCUMENTS

| | | | |
|---|---|---|---|
| 4,183,136 | 1/1980 | Colla | 29/835 |
| 4,270,465 | 6/1981 | Lim | 101/127 |
| 4,515,297 | 5/1985 | Schoenthaler | 427/96 |
| 4,622,239 | 11/1986 | Schoenthaler | 427/96 |
| 4,664,945 | 5/1987 | Maeda | 427/96 |
| 4,666,732 | 5/1987 | Schucker | 427/8 |
| 4,715,278 | 12/1987 | Ericsson | 101/123 |
| 4,722,470 | 2/1988 | Johary | 427/282 |
| 4,868,007 | 9/1989 | Taguchi | 427/96 |
| 4,935,261 | 6/1990 | Srivastava | 427/96 |

FOREIGN PATENT DOCUMENTS

| | | | |
|---|---|---|---|
| 278457 | 8/1988 | European Pat. Off. | 427/96 |
| 314012 | 5/1989 | European Pat. Off. | 427/96 |
| 318798 | 12/1988 | Japan | 427/96 |

*Primary Examiner*—Shrive Beck
*Assistant Examiner*—Vi Duong Dang
*Attorney, Agent, or Firm*—Pablo Meles; William E. Koch; Thomas G. Berry

[57] ABSTRACT

A method for controlling the mass of solder applied to a printed circuit substrate (202) by a solder printer (200), whereby the mass of solder paste (114) applied to a printed circuit substrate (202) is controlled by measuring the mass of the solder paste (114) that was applied to a first printed circuit substrate. The mass data measured is then compared to a predetermined mass to produce a control signal. The mass of the solder applied to a second printed circuit substrate is controlled as a function of the control signal so that the mass of the solder applied to the second substrate more closely approaches the predetermined mass.

4 Claims, 2 Drawing Sheets ial. No. 07/634,946 filed Dec. 28, 1990, now abandoned, which
METHOD FOR CONTROLLING SOLDER PRINTER This is a continuation of application Ser. No. 07/634,946 filed Dec. 28, 1990, now abandoned, which was a continuation of application Ser. No. 07/384,354 filed Jul. 24, 1989, also now abandoned.

TECHNICAL FIELD

This invention relates generally to the field of solder printers, and more specifically to automatic control methods for applying solder to printed circuit substrates.

BACKGROUND

Present methods for controlling the application of solder to printed circuit substrates by automatic solder printers require the presence of an operator to monitor the amount of solder paste applied to the printed circuit substrates. In the event that the solder printer is applying undesired amounts (i.e., too much or too little) of solder, the operator typically must stop the solder printer and correct the process.

SUMMARY OF THE INVENTION

Accordingly, it is an object of the present invention to provide a method for controlling the amount of solder applied by an automatic solder printer that avoids the shortcomings of the prior methods.

Briefly, according to the invention, the quantity of solder paste applied by a solder printer to a printed circuit substrate is controlled by measuring the mass of the applied solder paste and comparing that mass to a predetermined mass to produce a control signal. The mass of the solder applied to subsequent printed circuit substrates is then controlled as a function of the control signal so that the mass of the solder applied to the subsequent substrates more closely approaches the predetermined mass.

DETAILED DESCRIPTION OF THE PREFERRED EMBODIMENT

Figure 1:
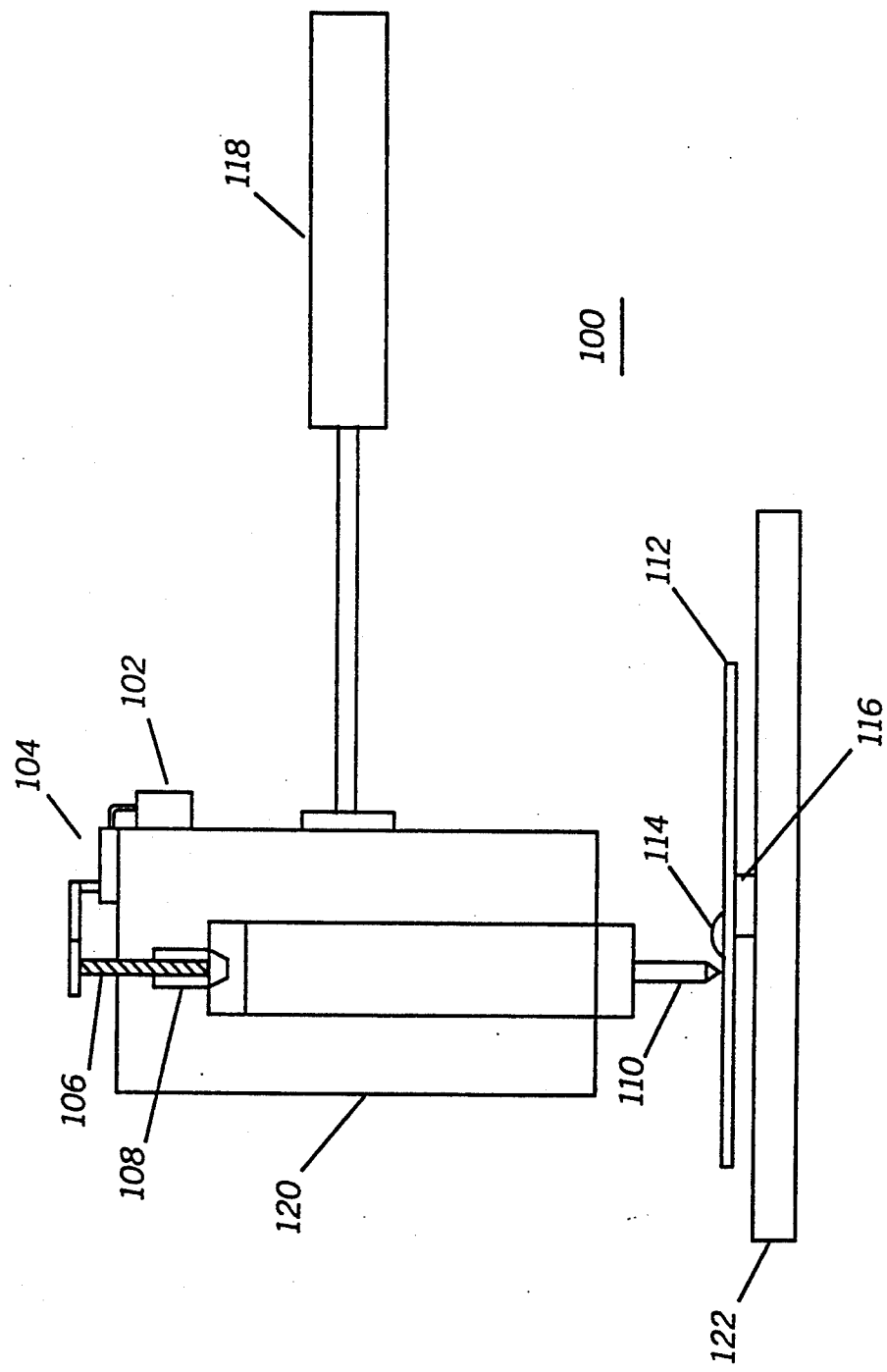
FIG. 1 shows a solder printer with respect to which the present invention may be applied.

Referring to FIG. 1, a solder printer 100 with respect to which the present invention may be applied is shown. A stepper motor control 102 controls a stepper motor 104, driving a lead screw 106 of a micrometer 108, which determines the vertical positions of the squeegee 110 with respect to a stencil 112. A printed circuit substrate 116 is disposed between the stencil 112 and a tooling plate or carriage 122. The pressure exerted by a squeegee 110 on the stencil 112 drives an effective amount of solder paste 114 into through-holes in the stencil (not shown) as the squeegee 110, driven by the hydraulic system 118, moves across the stencil. Thus the solder paste 114 is applied to the printed circuit substrate 116 only where permitted by the stencil. The pressure applied to the stencil 112 by the squeegee 110 may be increased or decreased by moving the squeegee 110 closer or farther from the stencil 112, respectively.

As a large number of printed circuit substrates are processed in the above manner, solder paste begins to accumulate between the stencil 112 and the printed circuit substrate. This causes the amount of solder paste 114 that is applied to printed circuit substrates to vary. Usually when such variation is detected, an operator must stop the process and take whatever steps are necessary to correct the quantity of solder paste to be applied to subsequent printed circuit substrates.

Figure 2:
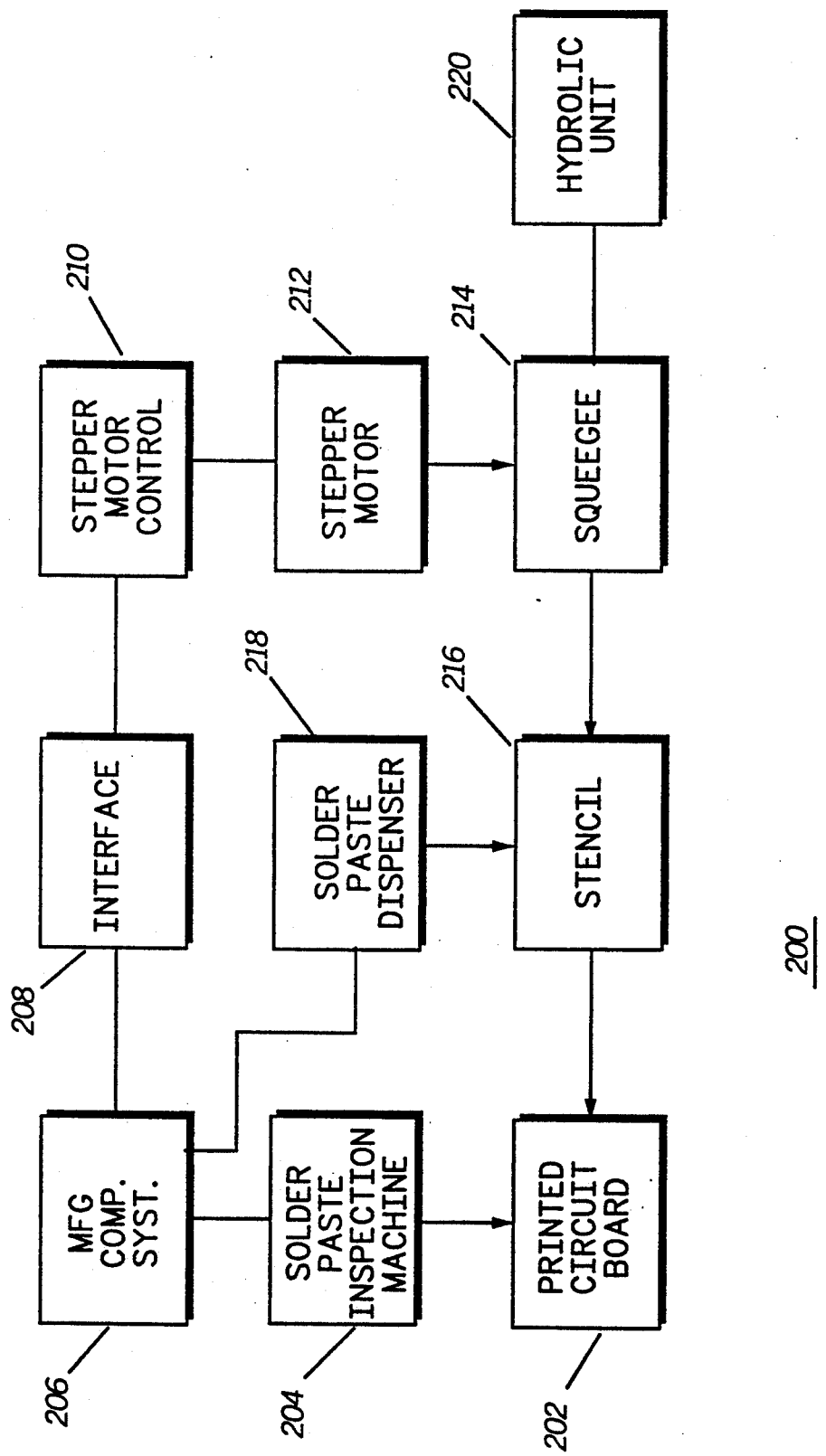
FIG. 2 is a block diagram of a solder printer control system in accordance with the invention.

Referring to FIG. 2, a block diagram of a solder printer control system in accordance with the invention is shown. According to the present invention, a solder paste inspection machine 204 measures the mass of the solder paste applied to a printed circuit substrate 202 (possibly by weighing the printed circuit substrate before and after the application of solder paste and noting the difference in weight, or by measuring the volume of the applied paste). The mass of applied solder paste is compared with a predetermined mass (or with a range of masses) by a manufacturing computer system 206. The manufacturing computer system 206, through interface 208, applied a control signal to a stepper motor control 210 which controls stepper motors 212. Each stepper motor 212 is bi-directional and is used to control the position of a squeegee 214 with respect to a stencil 216. That position, in turn, controls the pressure exerted by the squeegee on the stencil 216.

A solder paste dispenser 218 applies a certain quantity of solder paste to the stencil 216. The solder paste dispenser 218 is internally calibrated to replace solder paste that is used in each application. The stencil 216 is placed over the printed circuit substrate 202 so that the openings through the stencil 216 correspond to the areas on the printed circuit substrate on which the solder paste is to be applied. The squeegee 214 is moved by a hydraulic system 220 over the stencil 216 to force an effective quantity of solder paste into the openings in the stencil 216. When the squeegee is higher above the stencil 216 there is less pressure on the stencil and consequently more solder paste is applied to the printed circuit substrate. When the measured mass is greater than the predetermined mass, the manufacturing computer system 206 instructs the stepper motor control 210 to move the stepper motor 212 closer to the stencil 216, thus increasing the pressure on the stencil 216 and decreasing the mass of solder to be applied to the printed circuit substrate 202. On the other hand, when the measured mass is less than the predetermined mass, the manufacturing computer system 206 instructs the stepper motor control 210 to move the stepper motor 212 farther from the stencil 216, thus decreasing the pressure on the stencil 216 and increasing the mass of solder paste to be applied to the printed circuit substrate 202.

The solder paste inspection machine 204 may also measure the position of the squeegee 214 and compare that position with a predetermined position. When the position of the squeegee 214 differs from the predetermined position, the stepper motor control 212 will adjust the position of the squeegee to more closely approach that predetermined position. Similarly, the solder inspection machine 204 can be used to measure both the mass of the solder paste applied to a selected printed circuit substrate and the position of the squeegee 214 with respect to the stencil 216 and control the amount of solder paste applied to a subsequent printed circuit substrate as a function of the mass and position date measured.

What is claimed is:

1. In an automatic solder printer, having a stencil and a squeegee, a method for sequentially applying solder paste to printed circuit substrates comprising the steps of:

(a) applying solder paste to a first printed circuit substrate;

(b) measuring the mass of the solder paste that was applied to the first printed circuit substrate to produce first mass data;

(c) comparing the mass data measured in step (b) to a predetermined mass to produce second mass data; and (d) adjusting operation of the squeegee in applying solder to a second printed circuit board as a function of the second mass data so that the pressure of the squeegee against the stencil is increased when the first mass data measured in step (b) is greater than the predetermined mass and so that the pressure of the squeegee against the stencil is decreased when the first mass data measured in step (b) is less than the predetermined mass.

2. The method for sequentially applying solder paste to printed circuit substrates of claim 1 wherein step (b) comprises the steps of:

(b1) weighing the printed circuit substrate before and after application of the solder paste; and (b2) determining the difference in the weight of the printed circuit substrate before and after application of the solder paste to produce first mass data.

3. The method for sequentially applying solder paste to printed circuit substrates of claim 1 wherein step (b) comprises the step of:

(b1) measuring the volume of the solder paste after application to the first printed circuit substrate.

4. In an automatic solder printer, having a stencil and a squeegee, a method for sequentially applying solder paste to printed circuit substrates comprising the steps of:

(a) applying solder paste to a first printed circuit substrate by moving the squeegee over the stencil;

(b) measuring the position of the squeegee with respect to the position of the stencil to produce first position data;

(c) comparing the first position data measured in step (b) to a predetermined position to produce second position data; and (d) adjusting the position of the squeegee in applying the solder paste to a second printed circuit substrate as a function of the second position data so that the squeegee is moved closer to or farther from the stencil to compensate for variations from the predetermined position when the positions measured in step (b) is different from the predetermined position.

* * * * *